(12) United States Patent
Koch

(10) Patent No.: US 7,861,191 B2
(45) Date of Patent: Dec. 28, 2010

(54) METHOD AND APPARATUS FOR CHARACTERIZING SIGNALS

(75) Inventor: Klaus Koch, Munich (DE)

(73) Assignee: Infineon Technologies AG, Munich (DE)

( * ) Notice: Subject to any disclaimer, the term of this patent is extended or adjusted under 35 U.S.C. 154(b) by 877 days.

(21) Appl. No.: 11/740,209

(22) Filed: Apr. 25, 2007

(65) Prior Publication Data

US 2008/0265974 A1 Oct. 30, 2008

(51) Int. Cl.
*G06F 17/50* (2006.01)
(52) U.S. Cl. .............................. 716/1; 716/6
(58) Field of Classification Search ...... 716/1, 716/6
See application file for complete search history.

(56) References Cited

U.S. PATENT DOCUMENTS

| 5,392,046 | A * | 2/1995 | Hughes | 342/22 |
| 6,405,348 | B1 * | 6/2002 | Fallah-Tehrani et al. | 716/4 |
| 6,775,405 | B1 * | 8/2004 | Zhu | 382/154 |
| 2002/0199103 | A1 | 12/2002 | Dube | |
| 2004/0175057 | A1 * | 9/2004 | Tsao et al. | 382/294 |

FOREIGN PATENT DOCUMENTS

EP 1 662 410 A1 5/2006

WO WO 02/32043 A1 4/2002

OTHER PUBLICATIONS

Keller, I., et al., "A robust cell-level crosstalk delay change analysis," IEEE, 2004, pp. 147-154.
Hashimoto, M., et al., "Equivalent Waveform Propagation for Static Timing Analysis,"Proceedings of the International Conference on Computer-Aided Design, Nov. 11-13, 2003, pp. 169-175.
Hashimoto, M., et al., "Equivalent Waveform Propagation for Static Timing Analysis," IEEE Transactions on Computer-Aided Design of Integrated Circuits and Systems, vol. 23, No. 4, Apr. 2004, pp. 498-508.
Nazarian, S., et al., "Sensitivity-Based Gate Delay Propagation in Static Timing Analysis," IEEE, 2005, 6 pages.
Nazarian, S., et al., "Modeling and Propagation of Noisy Waveforms in Static Timing Analysis," IEEE, 2005, 2 pages.
Dartu, F., et al., "Calculating Worst-Case Gate Delays Due to Dominant Capacitance Coupling," Design Automation Conference, 1997, 6 pages.
Shore, J.E., et al., "Axiomatic Derivation of the Principle of Maximum Entropy and the Principle of Minimum Cross-Entropy," IEEE Transactions on Information Theory, vol. IT-26, No. 1, Jan. 1980, pp. 26-37.
Shore, J.E., et al., "Properties of Cross-Entropy Minimization," IEEE Transactions on Information Theory, vol. IT-27, No. 4, Jul. 1981, pp. 472-482.
Boyd, S., et al., "Convex Optimization," 2004, 730 pages, The Press Syndicate of the University of Cambridge, UK.

(Continued)

*Primary Examiner*—Jack Chiang
*Assistant Examiner*—Suchin Parihar
(74) *Attorney, Agent, or Firm*—Slater & Matsil, L.L.P.

(57) ABSTRACT

Methods and corresponding computer systems for characterizing signals and applications thereof are provided that use a functional depending on signal waveforms.

47 Claims, 8 Drawing Sheets

OTHER PUBLICATIONS

Zhu, K., et al., "Clock Skew Minimization During FPGA Placement," IEEE Transactions of Computer-Aided Design of Integrated Circuits and Systems, vol. 16, No. 4, Apr. 1997, pp. 376-385.

"Lagrange multipliers," http://en.wikipedia.org/wiki/Langrange_multipliers [online], downloaded Mar. 21, 2007, 5 pages.

Vemuri, B.C., et al., "Cumulative Residual Entropy, A New Measure of Information & its Application to Image Alignment," International Conference on Computer Vision, 2003, pp. 1-8.

Téllez, G.E., et al., "Minimal Buffer Insertion in Clock Trees with Skew and Slew Rate Constraints," IEEE Transactions on Computer-Aided Design of Integrated Circuits and Systems, vol. 16, No. 4, Apr. 1997. pp. 333-342.

Chandy, J.A. et al., "An Evaluation of Parallel Simulated Annealing Strategies with Application to Standard Cell Placement," IEEE Transactions on Computer-Aided Design of Integrated Circuits and Systems, vol. 16, No. 4, Apr. 1997, pp. 398-423.

Tazawa, S., et al., "A High-Speed 2-D Topography Simulator Based on a Pixel Model," IEEE Transactions on Computer-Aided Design of Integrated Circuits and Systems, vol. 16, No. 4, Apr. 1997, pp. 386-397.

Vecchi, M.C., et al., "An Efficient Solution Scheme for the Spherical-Harmonics Expansion of the Boltzmann Transport Equation," IEEE Transactions on Computer-Aided Design of Integrated Circuits and Systems, vol. 16, No. 4, Apr. 1997, pp. 353-361.

Chen, M-J., et al., "A Three-Parameters-Only MOSFET Subthreshold Current CAD Model Considering Back-Gate Bias and Process Variation," IEEE Transactions on Computer-Aided Design of Integrated Circuits and Systems, vol. 16, No. 4, Apr. 1997, pp. 343-352.

Hira, M., et al., "Verification of Tempura Specification of Sequential Circuits," IEEE Transactions on Computer-Aided Design of Integrated Circuits and Systems, vol. 16, No. 4, Apr. 1997, pp. 362-375.

De Boer, P-T., et al., "A Tutorial on the Cross-Entropy Method," Sep. 2, 2003, pp. 1-47.

"Functional (mathematics)," http://en.wikipedia.org/wiki/Functional_(mathmetics), downloaded on Jun. 4, 2010.

"Cross-entropy method," http://en.wikipedia.org/wiki/Cross-entropy_method, downloaded on Jun. 4, 2010.

"Kullback-Leibler divergence," http://en.wikipedia.org/wiki/Kullback%E2%80%93Leibler_divergence, downloaded on Jun. 4, 2010.

Rowland, T., "Functional," From *Mathworld*—A Wolfram Web Resource, created by Eric W. Weisstein, http://mathworld.wolfram.com/Functional.html, downloaded on Jun. 2, 2010.

* cited by examiner

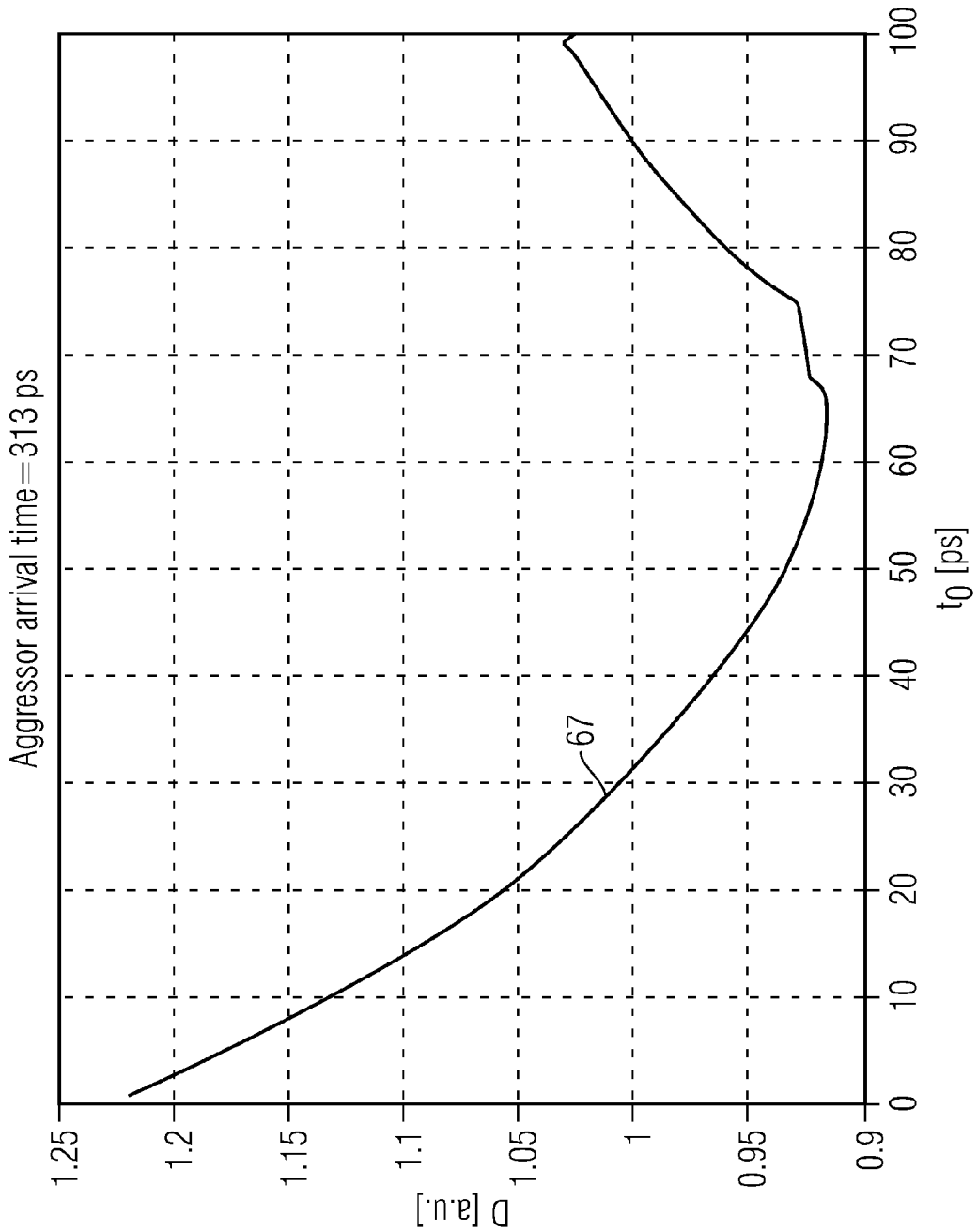

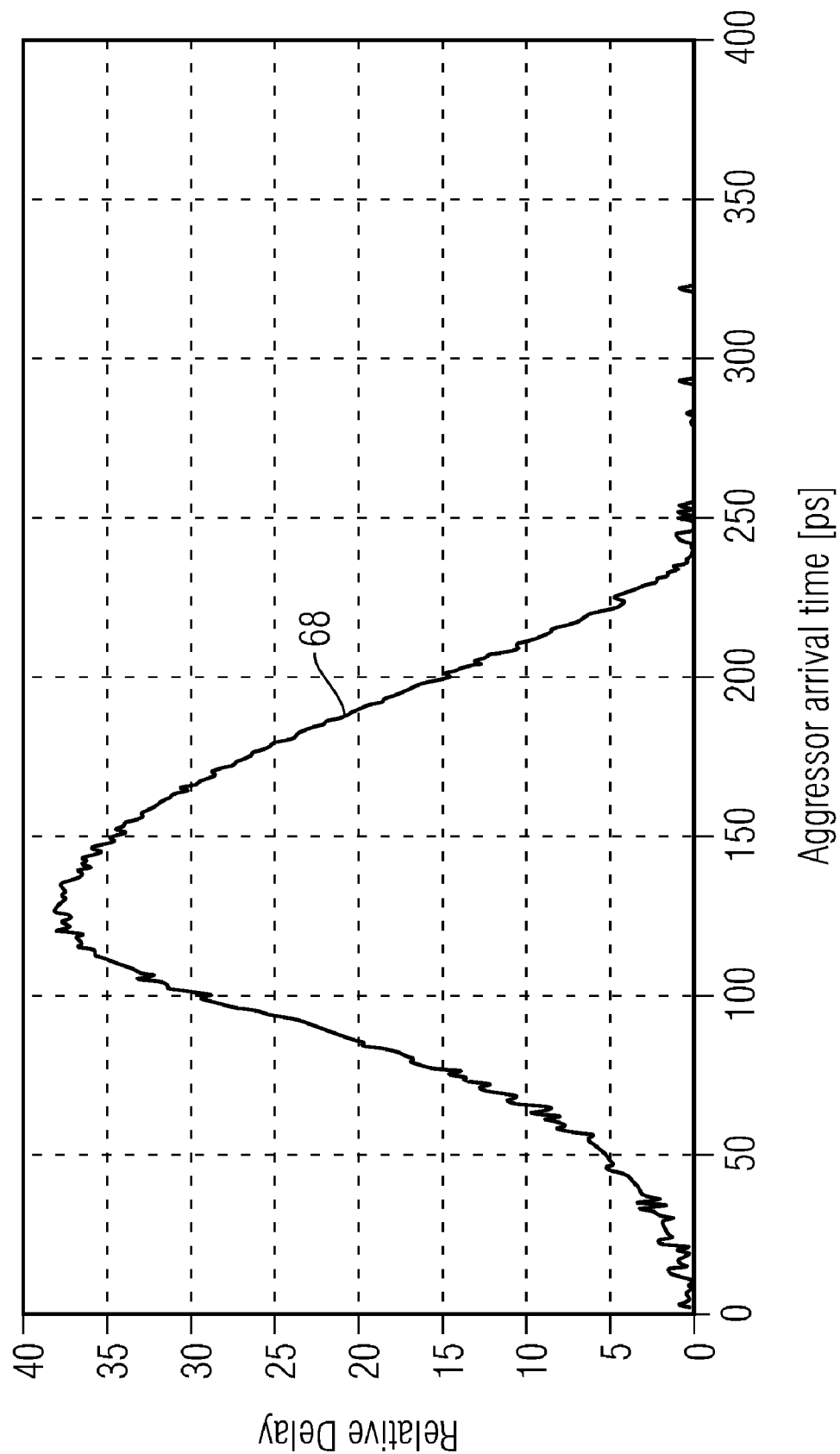

METHOD AND APPARATUS FOR CHARACTERIZING SIGNALS

BACKGROUND

The present invention relates to methods and apparatuses for characterizing signals and to applications thereof.

BRIEF DESCRIPTION OF THE DRAWINGS

For a more complete understanding of the present invention, and the advantages thereof, reference is now made to the following descriptions taken in conjunction with the accompanying drawings, in which:

FIGS. 8-11 show simulation results obtained by embodiments of the present invention.

DETAILED DESCRIPTION OF ILLUSTRATIVE EMBODIMENTS

In the following embodiments, methods and apparatuses for characterizing signals and applications thereof will be discussed. Characterizing signals, in this respect, relates to the determination of signal properties like a delay of a signal with respect to another signal or a slew of a signal. Slew generally characterizes the time a signal takes to switch from one signal state to another signal state, for example, the time a digital signal takes to change from a logic 0 to a logic 1. Another example for a signal property is the degradation of the shape or waveform of a signal, e.g., compared with an original signal.

According to an embodiment, such methods and apparatus for characterizing signals are used for analyzing electronic circuits, for example, in the context of static timing analysis which is a conventional method for analyzing the timing of a circuit based on a netlist of the circuit.

In order to make the following explanations of embodiments of the invention more clear, some terms and issues which will be used in the description of the embodiments will be discussed first with reference to FIGS. 1-3.

A first issue which will be briefly discussed is the issue of crosstalk influencing waveforms of signals. Crosstalk generally refers to the effect that signals in one signal path influence and modify signals in another signal path and, through modifying them, change their properties like delay, slew and the like. Signals, in the context of the present application, may be voltage signals, current signals, and products of these. The signals may be measured, simulated or computed at nodes of a circuit.

Figure 1:
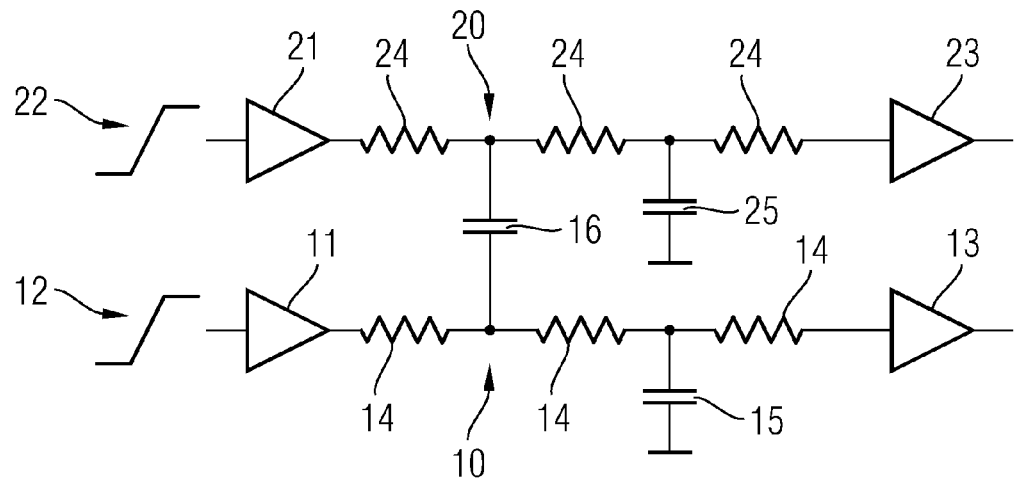
FIG. 1 shows a circuit comprising a victim net and an aggressor net.
Figure 2:
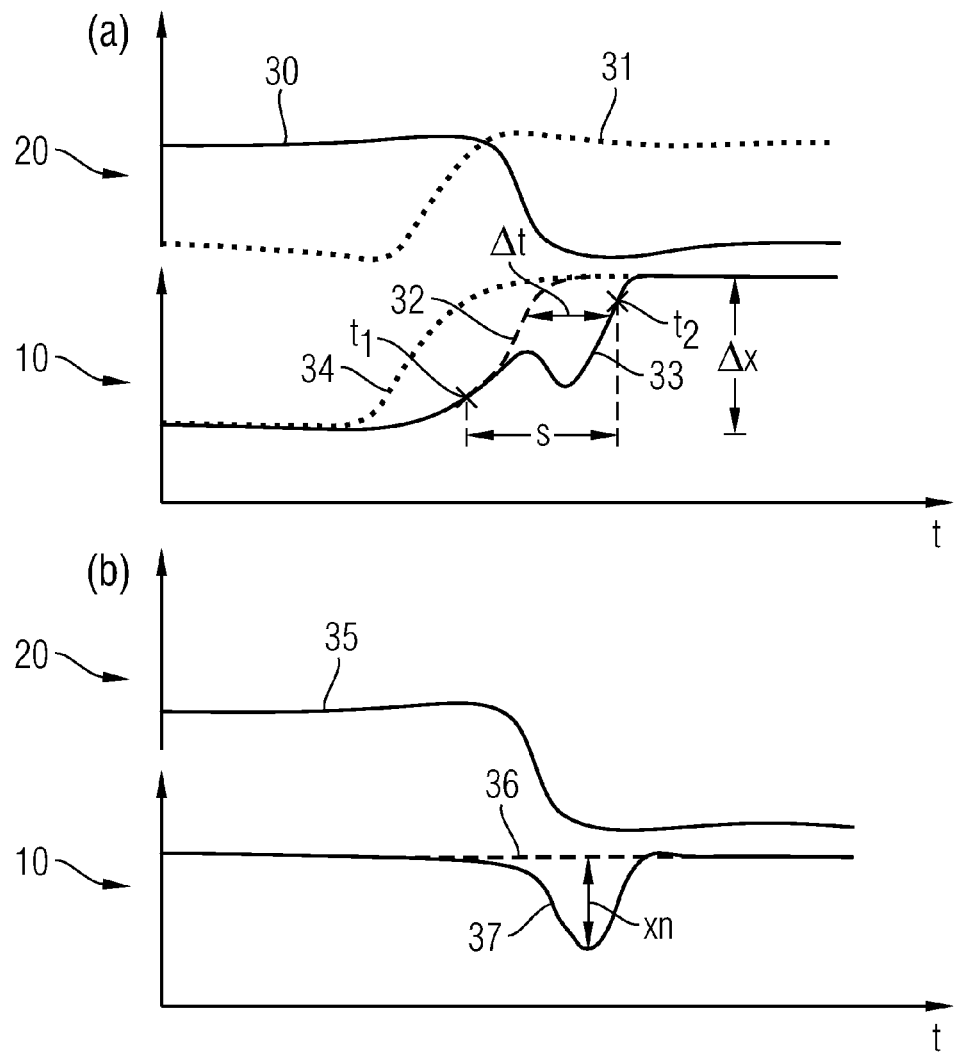
FIGS. 2a and 2b, shown collectively as, FIG. 2 illustrates different effects of crosstalk in the circuit of FIG. 1.

As an example, FIG. 1 shows a so-called victim net 10 comprising an input gate or driver 11 and an output gate or driver 13 connected by an RC network comprising resistors 14 and a capacitor 15 coupling victim net 10 to ground. Signals are passed through victim net 10 which, in FIG. 1 at an input of input driver 11 are represented as an ideal signal ramp of a digital signal 12, i.e., a linear ramp corresponding to a signal transition from a first state (for example, logic 0) to a second state (for example, logic 1).

Furthermore, in FIG. 1 an aggressor net 20 is shown comprising an input gate or driver 21, an output gate or driver 23 and an RC network comprising resistors 24 and a capacitor 25 coupling the RC network to ground is shown. Aggressor net 20 and victim net 10 are, in the example shown, coupled capacitively as represented by a coupling capacitor 16.

A signal 22 also represented by an ideal ramp is fed to aggressor net 20 via its input driver 21. The output driver 13 in the example of FIG. 1 represents an output load to the victim net 10, whereas output driver 23 represents an output load of the aggressor net 20.

Through the capacitive coupling represented by coupling capacitor 16 the signal 22 passing through the aggressor net 20 changes the signal 12 passing through the victim net 10. As a matter of course, the designations "victim net" and "aggressor net" are generally arbitrary designations, since a signal in the victim net may also modify a signal in the aggressor net. For the purpose of discussion, "victim net" designates the net or circuit part of the signals which are characterized, whereas "aggressor net" generally relates to nets or circuit parts which influence the signals in the victim net. Furthermore, the victim net and aggressor net shown only serve as an illustrative example, and similar situations may occur in any kind of electronic circuits or parts thereof. The capacitive crosstalk through the capacitive coupling shown becomes stronger when distances between signal paths are small. Other kinds of crosstalk may depend on other parameters. For example, crosstalk induced by inductive coupling becomes stronger when the area spanned by the relevant current paths increases. It should be noted that more than one aggressor net may be present.

The effect of signals in the aggressor net influencing signals in the victim net 10 will be illustrated in an exemplary manner with reference to FIGS. 2a and 2b. In FIG. 2a, curve 30 shows a signal having a falling edge in aggressor net 20, and curve 31 shows a signal having a rising edge in aggressor net 20. Curve 32 shows a signal having a rising edge in victim net 10 without being influenced by a signal in the aggressor net. Curve 33 shows a resulting signal in victim net 10 which results when signal 32 is modified via the capacitive coupling by signal 30 of the aggressor net, and curve 34 shows a resulting signal in victim net 10 when signal 32 is modified by signal 31 in the aggressor net. As can be seen, compared with signal 32 signal 33 has a "bump" and reaches its final state later than signal 32 although the onset of the state change, i.e., the state of the rising of the signal, is approximately the same.

Therefore, if a slew s were, e.g., defined as a time between a first time t1 at which the signal has increased to 20% of a total amplitude Δx and a second time t2 at which the signal has increased to 80% of the total amplitude Δx, it may be easily seen from FIG. 2a that through the influence of signal 30 in the aggressor net, the slew s becomes significantly larger compared with the undisturbed case of signal 32.

Furthermore, signal 33 as already mentioned is shifted to a later time by a delay Δt. On the other hand, signal 34 rises faster and earlier than signal 32, such that in this case a negative delay is induced.

Therefore, from FIG. 1 it can be clearly seen that crosstalk between an aggressor net and a victim net may influence both delay and slew of signals. It should be noted that curves 33 and 34 only serve as examples of how a signal in a victim net may be modified by one or more signals in one or more aggressor nets. In general, for signals as shown by curve 32 bumps in the signal and/or effective shifts of the signal may be caused by crosstalk.

A different situation is shown in FIG. 2b. In FIG. 2b, in aggressor net 20 a signal 35 having a falling edge is present, wherein in the undisturbed case no state change, i.e., no falling or rising edge, is present in victim net 10 as represented by signal 36. Through the influence of the signal in the aggressor net the undisturbed signal 36 is modified to a signal 37 having a "bump" with depth xn.

The delay introduced by crosstalk as explained with reference to FIG. 2a is added to the delay of signals when passing through victim net 10 or more generally an electronic circuit. Examples of such delays will be given with reference to FIG. 3.

Figure 3:
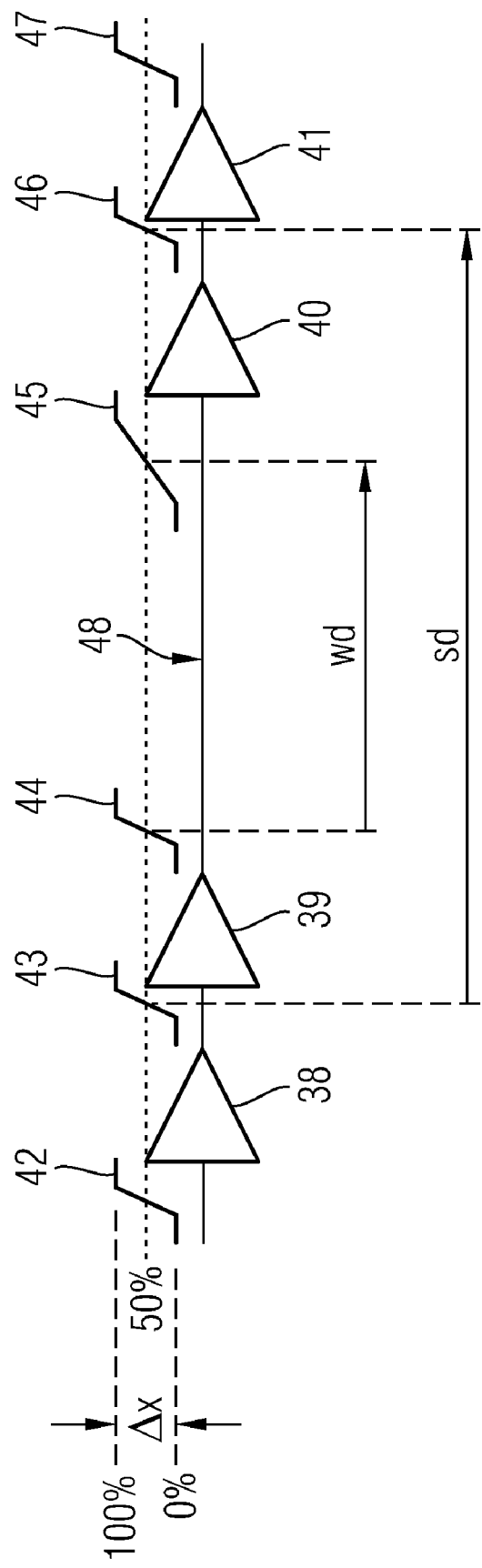
FIG. 3 shows a circuit diagram for explaining delays.

In the exemplary situation of FIG. 3, a signal 42 is fed to a gate or driver 38, which outputs a signal 43 which is in turn fed to a gate or driver 39. Driver 39 outputs a corresponding signal 44 which passes via a signal path 48 to a gate or driver 40. The time signal 44 takes to arrive at driver 40 is denoted as wire delay wd in FIG. 3. Driver 39, path 48 and driver 40 may for example be configured like victim net 10 of FIG. 1 wherein driver 11 corresponds to driver 39 and driver 13 corresponds to driver 40.

Through inductances and/or capacitances of path 48 the waveform of signal 44 changes to signal 45. In the example shown, the slope of the ramp increases, i.e., the slew changes. In crosstalk analysis, two successive driver cells like drivers 39 and 40 with the corresponding interconnection (path 48 in the example) are sometimes also called a stage, and the corresponding delay from the input of driver 39 to the output of driver 40 is called stage delay and designated sd in FIG. 3. It should be noted that in other circuit analysis contexts a stage sometimes also is defined as extending from an input of a driver (e.g., driver 39) to an input of a receiver receiving the signal of the driver (e.g., driver 40). Also in such a case, a stage delay may be defined.

An output signal of driver 40 is labeled 46 in FIG. 3 and fed to a further driver 41, which outputs a corresponding output signal 47.

As long as the signals are simple ramps as shown in FIG. 3, a point in time when the signal ramp reaches a certain voltage, for example 50% of their total amplitude as shown in FIG. 3, may be taken as the arrival time, and the corresponding delays may be simply taken as the differences of these arrival times as shown in FIG. 3 for wire delay wd and stage delay sd. Furthermore, as already mentioned, the slew may be taken as the time between the crossing of two reference points, for example, 20% of the amplitude and 80% of the amplitude. However, as can already be seen, for example, from curve 43 in FIG. 10, through crosstalk the waveform of signal changes from simple ramp-like structures and may, through bumps, for example, cross a reference line like 50% of the total amplitude a plurality of times. It should be noted that ramps are only used as an example here and drivers or other cells may also generate nonlinear waveforms, e.g., waveforms of the exponential family. These waveforms may, through the influence of crosstalk, change in a similar manner as explained above for ramps.

Besides the issues of crosstalk, delay and slew which have been discussed above further terms which will be used in the description of embodiments which will follow are "cumulative distribution function" (cdf), "partial distribution function"(pdf) and "regular undisturbed waveform". A "cumulative distribution function" is any monotonic function, the value of which goes from 0 to 1 or from 1 to 0. The ramps 12, 22 of FIG. 1 are examples of such cumulative distribution functions changing from a logic 0 to a logic 1. Other examples which also may be used as idealized signals are sigmoid functions, beta functions, functions of the exponential family like Gaussian functions, gamma functions, Weibull functions and the like. Other suitable functions or distributions may be used as well. A "partial distribution function" is any function f for which $f \geqq 0$ and the area, i.e., the integral over the function with respect to an independent variable, is 1. The derivative of a cumulative distribution function generally is a partial distribution function or a partial distribution function multiplied by $-1$. Partial distribution functions are also known as probability density functions. It should be noted that a monotonic function between two values other than 0 and 1 may be scaled to be a cumulative distribution function.

A "regular undisturbed waveform" in the sense of the present invention fulfils the above definition of a cumulative distribution function, is very similar to one or can be built as a sum of cumulative distribution functions. Regular waveforms output by digital cells like the driver cells mentioned above with reference to FIGS. 1 and 3 fulfill such a criterion. Undisturbed, in this respect, e.g., relates to the waveform without influence by crosstalk, which, as can be seen, for example, in curve 33 in FIG. 2a, may change waveforms such that they are, for example, not monotonic any more.

The n-th central moment $E(X^n)$ of a partial distribution function $f(x)$ giving the probability distribution of a random variable X is given by:

$$E((X-a)^n) = \int_{-\infty}^{\infty} (x-a)^n f(x) dx, \qquad (1)$$

the first moment (n=1) with a=0 corresponding to the mean value, a is a constant. It should be noted that one or both limits of the integral may be set to a value other than infinity, for example, if f(x) represents a so-called truncated signal waveform. The corresponding variance var(X) is then given by:

$$\mathrm{var}(X) = E(X^2) - [E(X)]^2 \qquad (2)$$

Next, an embodiment of the present invention for measuring delay between signals and/or slew of signals will be explained with reference to FIG. 4.

Figure 4:
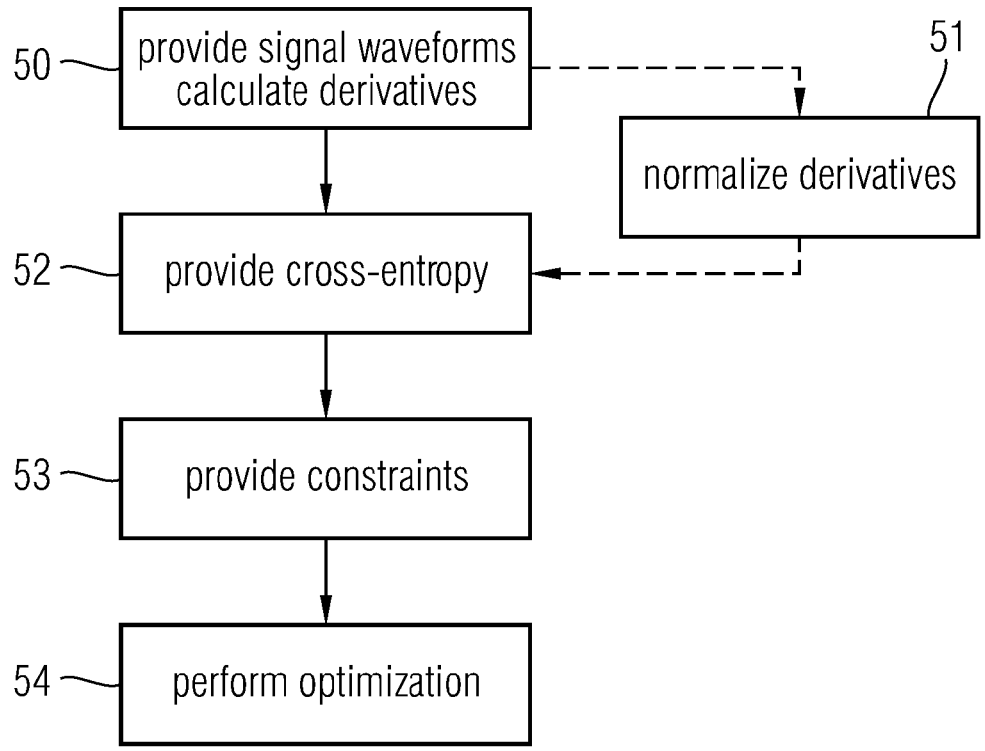
FIG. 4 shows a flowchart illustrating an embodiment of a method according to the present invention.

In step 50 of FIG. 4, signal waveforms of two signals are provided to measure the delay between the two signal waveforms and/or a relative slew of the signal waveforms. Such waveforms may, for example, be waveforms of signals 44 and 45 of FIG. 3 to measure wire delay wd or of signals 43 and 46 to measure the stage delay sd. The signal waveforms according to embodiments of the present invention may be derived from simulations like analog simulations using SPICE-based simulation tools or waveforms obtained in the process of performing a static timing analysis (STA). In other embodiments, the signal waveforms may be signal waveforms measured in an electronic circuit. In general, the signal waveforms in the case of digital circuits go from a level representing logic 0 to a level representing logic 1 or vice versa as already explained. The waveforms may be regular undisturbed waveforms as defined above or waveforms modified in some manner, for example, due to the presence of crosstalk, like it was explained for signals 33, 34 and 37 in FIG. 2.

The waveforms may be continuous waveforms, for example, represented by an analytic function or a parametrized waveform or may be present in the form of a plurality of points in time, for example, as a result of a simulation.

In step 50 also the first derivatives of the signal waveforms with respect to time are calculated. The derivatives of the two signal waveforms in the following will be designated p(t) and q(t). In an embodiment q corresponds to the later one of the two signal waveforms under consideration, for example, the one of signal 54 in FIG. 3 when the delay to signal 44 is to be considered. In the case of non-continuous signal waveforms, i.e., distribution-like signal waveforms comprising a plurality of points, the derivative is replaced by the difference quotients or by differences between adjacent points, the corresponding distributions will be designated $p_i$ and $q_i$, i being an index variable designating the respective points. When in the following the derivates p(t) and q(t) are mentioned, unless explicitly stated to the contrary, the statements made apply to the corresponding distributions $p_i$ and $q_i$ correspondingly, wherein the index I corresponds to time t. Index I and time t may be seen as time variables of the respective function or distribution.

In step 51, the derivatives calculated in step 50 are optionally normalized such that their integral (area) is 1. In case the original signal waveform was an undisturbed regular waveform, this corresponds to normalizing the derivatives to a partial distribution function as defined above. However, step 51 may also be omitted in the embodiment as indicated in FIG. 4.

In step 52, a cross entropy functional of the two derivatives p(t) and q(t) is provided. The cross entropy D(p, q) is a functional given by:

$$D(p, q) = \int dt\, p(t) \ln \frac{p(t)}{q(t)} \quad (3)$$

for continuous functions and by:

$$D(p, q) = \sum_{i=1}^{n} p_i \ln \frac{p_i}{q_i} \quad (4)$$

for discrete distributions, wherein the sum of equation (4) runs over all non-zero values of $p_i$ and $q_i$.

It should be noted that when p or q at a time $t_0$ or an index $i_0$ is zero, the term $$p \cdot \ln \frac{p}{q}$$

diverges. In an embodiment, to prevent such a divergence it is defined that:

$$0 \ln \frac{0}{0} = 0 \quad (5)$$

$$0 \ln \frac{0}{q} = 0$$

$$p \ln \frac{p}{0} = 0$$

In a different embodiment, it is defined that:

$$0 \ln \frac{0}{0} = c \quad (6)$$

$$0 \ln \frac{0}{q} = c$$

$$0 \ln \frac{p}{0} = c$$

wherein c is a constant which also may be set to infinity. As a matter of course, other variants than the one indicated by equations (5) and (6) are also possible. For example, different constants c may be used for the different cases of equations (6), or the cases of equations (5) and (6) may be mixed, e.g. by defining $$p \ln \frac{p}{0} = \infty$$

in equation (5). In embodiments, an additive constant C or an additive integral like C·∫q(t)dt is added to the right side of equation (3). The latter additive integral may, e.g., be used if ∫q(t)dt is not normalized to 1, and a similar integral may also be used for p(t).

As can be seen from equations (3) and (4), if the two functions or distributions p and q are identical, the logarithmic term is always 0, such that D(p, q) is 0. On the other hand, if p and q differ, a non-zero value D(p, q) results.

For example, in the context of circuit simulation or static timing analysis mentioned above, the signal waveforms and thus also their derivates p, q comprise a number of parameters which, for example, characterize the influence of crosstalk depending on transition times of signals in an aggressor net on the signal waveform under consideration in the victim net, properties of the circuit where the signals propagate, e.g., capacitances, resistance or inductances, properties of the signal waveforms, and the like. In other words, for example, a derivative p, while being a function of the time t, also depends on the number of further parameters or even further functions like the waveform of a signal in an aggressor net such that p(t) is actually $p(t, a_i)$, wherein the $a_i$ are the above-explained further parameters. As a matter of course, it is not required for the waveforms to have such parameters, and, for example, in the case of measured signal waveforms the signal waveforms may be taken as they are without considering parameters.

In case such parameters are indeed present, in step 53 of the embodiment of FIG. 4 constraints for the parameters may be given. Constraints, in this respect, relate to any requirements the parameters have to fulfill, for example earliest or latest time at which a signal in an aggressor net may change from 0 to 1 or vice versa, restrictions on coupling strength between aggressor net and victim net, etc. In an embodiment, these constraints are given in the form of equations having the form:

$$g_j(a_i) = d_j \quad (7)$$

wherein g is a function, the index j indicates the number of the constraint and $d_j$ is a constant, wherein the constant may be different for each constraint j. In other embodiments, constraints also include inequalities which may be written in a form like $g_j(a_i) \leq d_j$, $g_j(a_i) < d_j$, $g_j(a_i) \geq d_j$, $g_j(a_i) > d_j$, and the like, or bounds defining a range of a parameter and/or function thereof, like $d_{j,1} \leq g_j(a_i) \leq d_{j,2}$, wherein $d_{j,1}$ and $d_{j,2}$ are constants (as a matter of course, one or both of the "≦" may be replaced by "<", and corresponding ">" or "≧" relations may also be used).

In step 54, an optimization of the cross entropy provided in step 52 taking the constraints provided in step 53 into account is performed. According to an embodiment, this optimization is performed using the Lagrange method, which is an optimization method for optimizing functions wherein parameters, i.e., optimization parameters, of these functions are subject to constraints. In the Lagrange method, a Lagrange function is optimized which combines the function and the constraints. In the present case, in an embodiment such a Lagrange function has the form:

$$L(a_i, t_0) = D(p(a_i, t), q(a_i, t-t_0)) + \sum_j \lambda_j (g_j(a_i) - d_j) \qquad (8)$$

The $\lambda_j$ are called Lagrange parameters.

In other embodiments, variants of the Lagrange methods or other optimization methods may be used. For example, in case the constraints include the above-mentioned inequalities and bounds, inequalities may be transformed to equations using so-called slack variables (e.g., $g_j(a_i) \leq 0$ may be transformed to $g_j(a_i) + s_j^2 = 0$, wherein $s_j$ is a slack variable) to be used in the Lagrange optimization, or another method like BFGS (Broyden-Fletcher-Goldfarb-Shanno)-based methods (e.g., L-BFGS, L-BFGS-B) may be used.

In equation (8) an additional parameter $t_0$ has been introduced. This parameter $t_0$ as can be seen shifts the function q in time.

The optimization according to an embodiment is performed such that a minimum of the cross entropy with respect to the parameter $t_0$ is found. In other words, the function q is shifted in time to a minimum. The resulting value $t_0$ is taken as the delay between the two signals according to the present embodiment. The value of the cross entropy $D(p, q)$ at this delay is taken as a measure for the differences between the waveforms of the two signals, for example of the slew difference of the two signals or the degradation of the shape of one waveform with respect to the other waveform.

Figure 5:
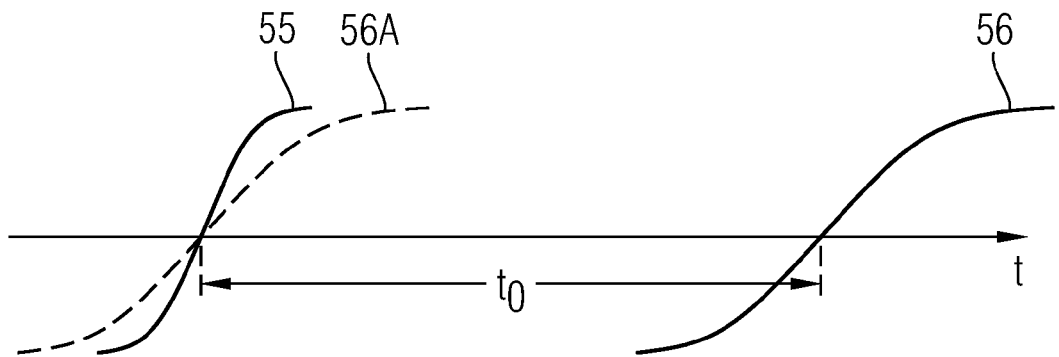
FIG. 5 is an explanatory diagram for explaining a method step of the embodiment of FIG. 4.
Figure 6:
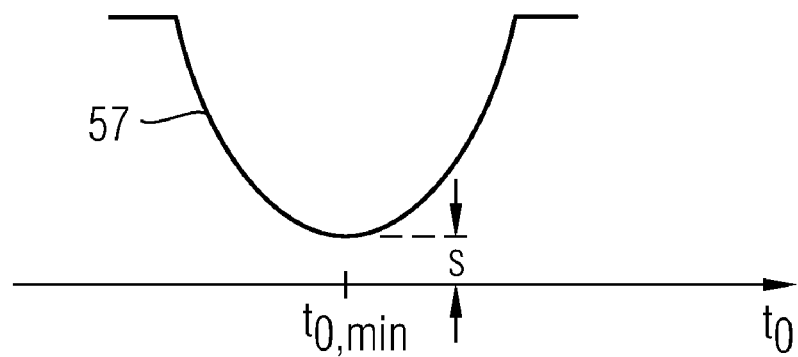
FIG. 6 is a further explanatory diagram for explaining a method step of the embodiment of FIG. 4.

This will be further explained with reference to FIGS. 5 and 6. In FIG. 5, two signals 55, 56 are shown as exemplary waveforms. As already has been explained above, when the two signal waveforms are identical (also with respect to their location in time), the cross entropy becomes 0. In case of non-identical waveforms, the cross entropy becomes minimal at a point which may be called the greatest overlap of the two signals when one signal is shifted in time. In other words, when signal 56 is shifted toward signal 55, the cross entropy between the derivatives as defined by equation (3) or (4) assumes a minimum at the point of greatest overlap, the shift $t_0$ necessary to attain this minimum being taken as the delay between the signals. This behavior of the cross entropy is schematically shown in FIG. 6 wherein curve 57 shows the cross entropy depending on the parameter $t_0$ in an exemplary manner. At $t_{0,min}$ a minimum value is assumed and $t_{0,min}$ is then taken as the delay between the signals. The value of the cross entropy function at $t_{0,min}$ which is denoted s in FIG. 6 according to the embodiment is taken as a measure for the differences in waveforms, for example, the differences in slew. In particular, the greater the difference regarding slew becomes, the greater the value of s becomes, and as already mentioned if the two waveforms are identical, s becomes 0.

It should be noted that the behavior of the cross entropy as schematically represented by curve 57 in FIG. 6 sufficiently far away from the minimum where the derivatives of both signals are 0 depends on the choice of the value of d for cases where one of the derivatives is 0, for example, the choice according to equations (5) or according to equations (6). In case the choice of equations (5) is used, the cross entropy becomes 0 sufficiently far away from the minimum $t_{0,min}$. In this case, in order to find the minimum the value $t_0$ according to an embodiment first is set to a value where the cross entropy is non-zero, for example, by increasing to in a step-wise manner.

Returning to FIG. 4 and step 54 thereof, in an embodiment with the Lagrange method the Lagrange function (8) is also optimized with respect to the parameters $a_i$. In an embodiment, with respect to these parameters $a_i$ the function is optimized to a maximum. This maximization corresponds to finding a worst case in which the differences in waveforms as indicated by parameter s of FIG. 6 becomes maximal. The corresponding delay $t_{0,min}$ then indicates the delay for this worst case. According to another embodiment, additionally or alternatively a minimization with respect to the parameters $a_i$ is performed, which corresponds to a best-case scenario. This, for example, may be used for optimizing a circuit, for example, by designing the circuit according to the optimized parameters $a_i$ of the best-case scenario.

In another embodiment, the parameters $a_i$ are optimized such that the value $t_{0,min}$ assumes an optimum, i.e., a maximum or a minimum. In other words, the parameters $a_i$ corresponding to a worst-case delay or a best-case delay are determined, which, as in the example above, may in an embodiment be used for optimizing the circuit. This corresponds to a two-folded optimization process, wherein a first optimization for determining $t_{0,min}$ is the objective function for optimizing the parameters $a_i$.

Such a Lagrange optimization also yields results for the parameters $\lambda_j$. The magnitude of these parameters indicate the influence of the respective constraint on the result. A large Lagrange parameter indicates that the corresponding constraint has a great impact on the result, and correspondingly a variation of the constraints would significantly change the result. On the other hand, a small Lagrange parameter indicates that the respective restraint has little impact on the result. Therefore, according to an embodiment, information is obtained regarding the influence of constraints like timings of signals in an aggressor net on delay and slew of a signal. Furthermore, the sign of the Lagrange parameter indicates the direction the result changes when the respective constraint is varied.

It should be noted that the normalizing step 51 which is optionally performed changes the value s in FIG. 6, but not the value $t_{0,min}$.

In the above-described embodiments, the cross entropy or a corresponding function like the Lagrange function of equation (8) is minimized with respect to the time shift parameter $t_0$. In a different embodiment, additionally or alternatively the cross entropy is minimized with respect to a slew parameter $a_s$ of a cross entropy functional of the form:

$$D(p(a_i, t), a_s \cdot q(a_i, a_s \cdot t)) \qquad (9)$$

Varying the slew parameter $a_s$ corresponds to varying the slope of signal waveform q.

As mentioned, these two possibilities may be combined by using, e.g., a cross entropy functional of the form:

$$D(p(a_i, t), a_s \cdot q(a_i, a_s \cdot (t-t_0))) \qquad (10)$$

and by minimizing with respect to $a_s$ and $t_0$.

Multiplying q with $a_s$ in equations (9) and (10) has the effect that the area of q is kept constant irrespective of the value of $a_s$. However, in other embodiments the multiplication of q with $a_s$ may be omitted. In yet other embodiments, instead of multiplying q with $a_s$ q is multiplied with a value other than $a_s$, which may be used for normalizing q.

This may be generally seen as subjecting the time t of function q to an affine transformation $t \rightarrow a_s \cdot (t-t_0)$, wherein in the case of equation (8) $a_s$ is set to 1 and in the case of equation (9) $t_0$ is set to 0.

It should further be noted that the optimizations of further parameters $a_i$ described above also apply to the cases of equations (9) and (10), such that, e.g., in embodiments a best-case or a worst-case analysis for $a_s$ may also be performed.

It should be noted that the choice of the sign "−" for $t_0$ in equations (8) and (10) is arbitrary, and a "+" sign may be used as well, which would also change the sign of the resulting value for $t_0$.

Furthermore, instead of, or in addition to, subjecting time t of function q to an affine transformation, in an embodiment, time parameter t of function p is subjected to an affine transformation.

As already mentioned, if instead of continuous functions p(t), q(t) distributions $p_i$, $q_i$ are used, the above-described optimizations and transformations apply to the index i instead of time t.

It should be noted that in the above-described embodiments coordinate transformations may be applied to signals and constraints, e.g., to scale the system to different voltage ranges, without substantially affecting the results. Such coordinate transformations may be phrased in Jacobian form.

Figure 7:
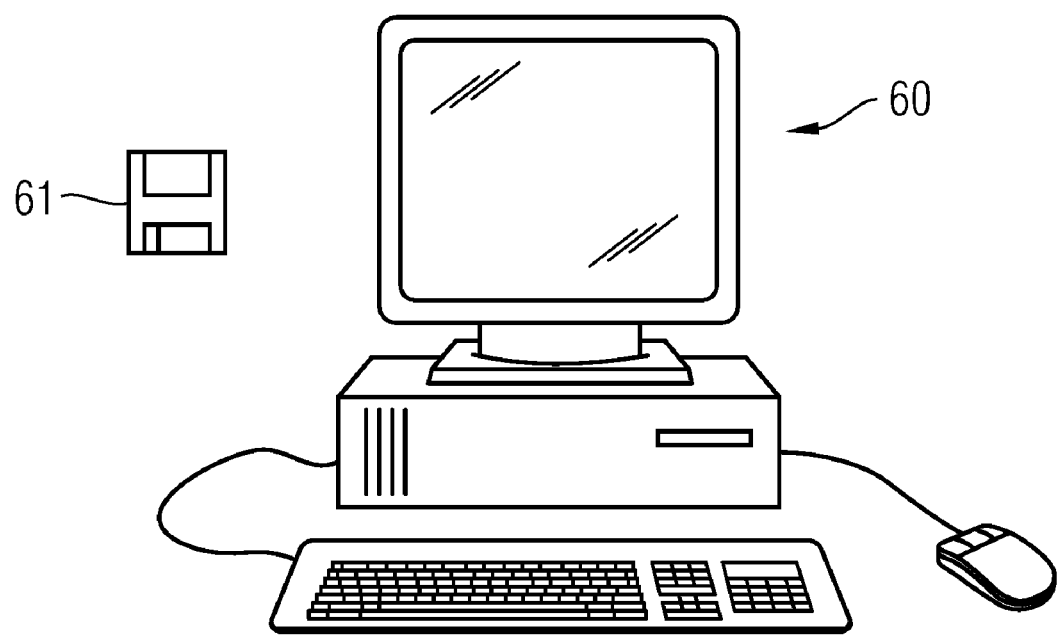
FIG. 7 shows an embodiment of an apparatus according to the present invention.

The method may be implemented in a personal computer system 60 shown in FIG. 7. The implementation may be within the context of a simulation program or a static timing analysis program, but also may be used as a standalone method for analysis and characterization of signals and their waveforms. A corresponding program may be stored on a data carrier like disk 61 shown in FIG. 7 and read to a memory of computer 60 therefrom wherein, when the program code is executed, a method according to an embodiment of the invention is performed. Instead of disk 61, CD-ROMs, DVDs, memories like RAM or ROM, signals carrying the program information via a communication line and the like may be used as data carriers.

Figure 8:
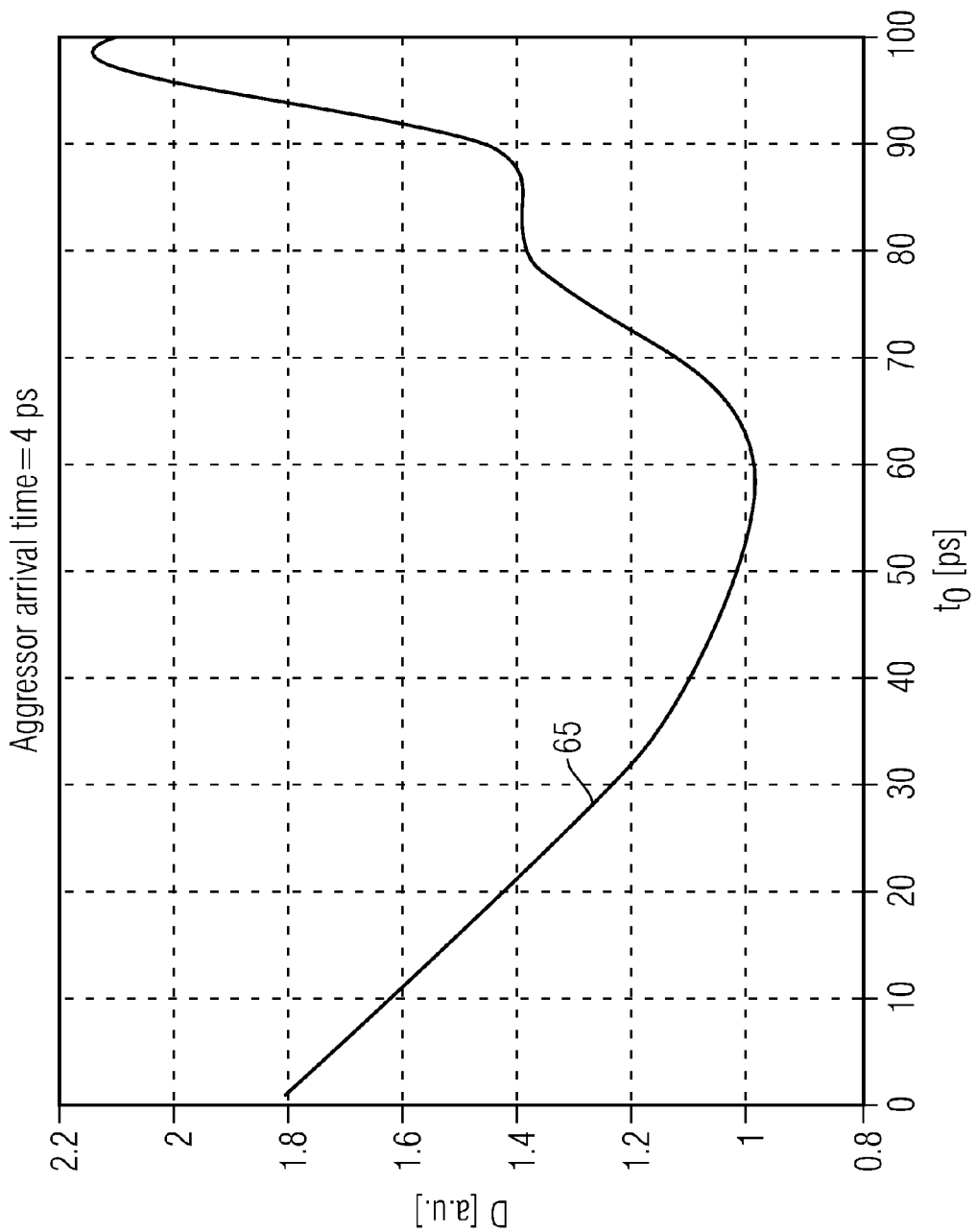
Figure 9:
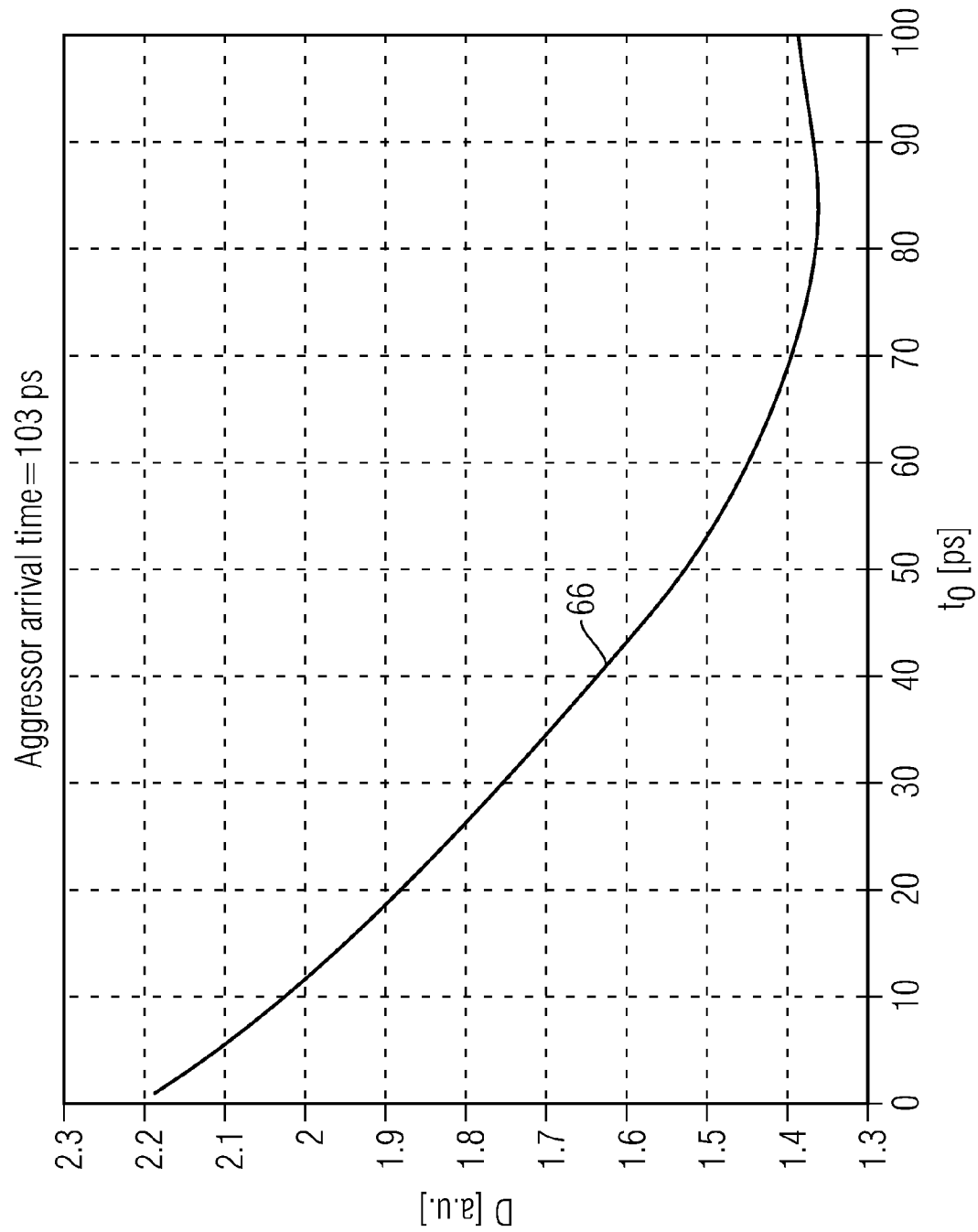

In an embodiment, the embodiment of FIG. 4 may be used for further characterizing the crosstalk behavior of a signal. For example, the method may be performed with different timings of signals in an aggressor net to analyze the resulting delay of a signal in a victim net. A corresponding exemplary analysis will be discussed with reference to FIGS. 8-11. FIGS. 8-10 show the cross entropy for different arrival times of a signal in an aggressor net depending on the time shift parameter $t_0$. The cross entropy may, for example, be taken between a signal at an output of driver 11 in victim net 10 of FIG. 1 and a signal at an input of driver 13 in victim net 10, whereas an aggressor signal is present in aggressor net 20 of FIG. 1.

Curve 65 in FIG. 8 shows the behavior of the cross entropy for an aggressor arrival time of 4 ps, curve 66 in FIG. 9 shows the behavior of aggressor arrival time of 103 ps and curve 67 in FIG. 10 shows the behavior of an aggressor arrival time of 313 ps. While the shape of the curves 65, 66 and 67 differ from each other, each curve has a well-defined minimum, which in case of curve 65 is at about 58 ps, in case of curve 66 at about 85 ps and in case of curve 67 at about 67 ps.

Such an analysis has been performed for a plurality of arrival times. The result is shown in FIG. 11, where the relative delay is shown depending on aggressor arrival time in a curve 68. Relative delay in this respect designates the delay change between the case without signal in the aggressor net and the case with signal in the aggressor net. As can be seen, with the method according to the present invention besides the measuring of delay and slew based on such a measure also the influence of crosstalk and its parameters like aggressor arrival time can be investigated, which in turn may be used for an optimization of the respective circuit.

In the following, further embodiments will be discussed based on the already discussed embodiments, for example, the embodiment of FIG. 4.

In the embodiment of FIG. 4, a delay and waveform difference are determined. As a matter of course, if only the delay or only the waveform difference is needed for some purpose, in a corresponding embodiment only the needed parameter is determined.

In order to provide an absolute measure for slew and/or delay, e.g., arrival time, a reference waveform, for example, a step function, may be used as one of the two waveforms provided in step 50. The waveform difference (parameter s in FIG. 6) with respect to this reference waveform is then taken as an absolute value of the slew or the deviation of the waveform from a step function, and/or the time shift ($t_{0,min}$ in FIG. 6) is taken as an absolute delay value. As a matter of course, in different embodiments any other reference waveform may also be used.

In the embodiment explained, the derivative of the later signal is shifted toward the earlier signal, which is the "physical" direction since, in situations like the one shown in FIG. 3, the later waveforms originates from the earlier waveform. However, in other embodiments, the derivatives of the waveforms may be shifted in another way relative to each other, for example, by shifting the earlier waveform.

While in the explanations of FIGS. 5 and 6 rising edges of digital signals are used as an example, the method may as well be applied to falling edges or, in other embodiments, to arbitrary signals.

Furthermore, while in the example ramp-like waveforms have been used, the method of FIG. 4 is equally applicable to other types of waveforms such as truncated distribution like waveforms as determined, for example, by a gamma function and other types of distributions of the exponential family, sigmoid waveforms, or any other kind of waveforms.

In other embodiments, one or both of the signals may be decomposed to a plurality of components, e.g., by performing a (multi-)scaling analysis. In this case, the above-described steps may be performed separately for each component, and the results may then be added up.

In the embodiment described, the derivatives of the two signal waveforms are used for determining the cross entropy according to equation (3) or (4). In case waveforms also comprise waveforms with bumps, for example, due to crosstalk like in case of signal 33 of FIG. 2, in an embodiment a constant is added to one of the derivatives or to both of the derivatives in order to prevent negative values of the functions considered. In other embodiments, the square or a general function a·x+b, wherein a and b are constants and x is the derivative, of the derivatives is used for calculating the cross entropy. In yet other embodiments, the absolute values may be used, or negative values may be set to 0. These operations, in other embodiments, are performed on the ratio p/q in the logarithmic term of equations (3) or (4).

In the embodiment of FIG. 4, the delay between two signals having respective waveforms is measured. In another embodiment, no single waveform, but one or two sets of waveforms are considered. Such a set of waveforms may, for example, comprise different earliest or latest waveforms resulting from a timing analysis.

In an embodiment, such a set of waveforms is parameterized, and the responding parameter(s) are included in the optimization, wherein also constraints (for example, range constraints) of these parameters may be taken into account. In another embodiment, an optimization is made for the set directly by performing a summation over all waveforms or derivatives thereof when calculating the cross entropy.

In another embodiment, instead of taking the derivative to calculate the cross entropy according to equation (3) or (4), the waveforms themselves are used without performing a differentiation. Also in this case, according to an embodiment the waveforms may be normalized first. Furthermore, also in this case, a delay is obtained, and the result according to an embodiment may be used to optimize the effects of crosstalk, for example, also the effects of bumps like the one shown in FIG. 2(b).

It should be noted that the optimization of the parameters $a_i$ according to an embodiment may also be used to obtain information regarding the probability, for example, of the worst case, i.e., a case with the greatest delay or a case with the greatest waveform difference. The constraints may also include constraints regarding the waveform of signals in the aggressor net, for example, by giving information regarding moments of signals in aggressor nets, moments being defined as in equation (1), or regarding a variance as defined by equation (2).

In another embodiment, a method similar to the one discussed with respect to FIG. 4 is used to find an equivalent waveform for a given waveform. In static timing analysis as well as in other analysis methods for electronic circuit, it is desirable to characterize a waveform with as few parameters as possible. For example, ramp waveforms like the one shown in FIG. 1 or 3 may be characterized by their slew or their slope and by their delay, i.e., two parameters. Therefore, for such applications it may be useful to find a waveform which may be described by only a few parameters which approximates a more complex waveform like a waveform having bumps, as waveform 33 in FIG. 2(a), as close as possible.

According to an embodiment, as one of the signals in a method similar to the one discussed with reference to FIG. 4 the signal for which an equivalent waveform is sought is used, and for the other signal a base waveform with adjustable parameters, for example, a ramp waveform which may be shifted in time by using parameter $t_0$ and the slope of which may be adjusted with a further parameter a is used. Then basically the method of FIG. 4 is performed, wherein the optimization is carried out such that the cross entropy gets minimal with respect to the parameters of the equivalent waveform, for example, the parameters $t_0$ and a in the example given above. The equivalent waveform with these parameters is then taken as equivalent to the waveform of the original signal.

In the above example, the cross entropy D(p, q) has been used. In other embodiments, other functionals may be used. For example, a symmetric functional F(p, q) according to:

$$F(p,q) = D(p,q) + D(q,p) = \int dt \left( p(t) \ln \frac{p(t)}{q(t)} + q(t) \ln \frac{q(t)}{p(t)} \right) \quad (11)$$

may be used. The above-mentioned functional may also be scaled with some scaling factor, which includes changing the natural logarithm ln to another logarithmic function using a base other than e.

In general, in some embodiments cross entropy based functionals are used which are functionals based on or derivable from the cross entropy functional as defined in equations (3) and (4). Such cross entropy based functionals g in embodiments may be formed by subjecting the cross entropy functional to transformations, like non-negative weighted sums:

$$g = w_1 f_1 + w_2 f_2 + \ldots w_n f_n \quad (12)$$

wherein $w_1, \ldots w_n$ are weight coefficients and $f_1 \ldots f_n$ are cross entropy functionals, compositions with an affine mapping:

$$g(x) = f(Ax+b) \quad (13)$$

wherein f is again a cross entropy functional and x represents the variables of f, pointwise maximum or supremum:

$$g(x) = \max(f_1(x), f_2(x)) \quad (14)$$

$$g(x) = \sup(f(x)) \quad (15)$$

wherein $f, f_1, f_2, x$ are defined as above, or transformations by using a convex and non-decreasing or concave and non-increasing function h according to:

$$g(x) = h(f(x)) \quad (16)$$

Other cross-entropy based functionals may be based on the so-called cross-cumulative residual entropy.

In another embodiment, for obtaining delay and slew, a functional G(f, h), wherein f(t) and h(t) are waveforms or derivatives thereof, according to:

$$G(f, h) = \int H \cdot \{f(t) - h(t)\}^2 dt \quad (17)$$

may be used. Also with such a function, if f and h are identical, the functional G assumes a 0, whereas for differences between f and h, G assumes non-zero values. H may be a function or parameter taking further properties of the circuit into account. For example, H may be defined according to:

$$H = \left| \frac{\partial v_{out}}{\partial v_{in}} \right|_{v_{in} = f(t)} \quad (18)$$

wherein $v_{out}$ and $v_{in}$ are output voltage and input voltage of a circuit element, for example a driver or a gate, to which, for example, waveform f is applied. With such a function H, the property of the gate or driver may be considered when calculating delays or measuring differences between waveforms.

In other embodiments, H may, for example, be a constant including the possibility of H being equal to 1.

In general, in embodiments of the present invention other functions or functionals based on cross entropy, entropy-like functions or norms may be used. Functions or functionals based on cross entropy in this respect relate to functions which comprises terms like the ones on equations (3) or (4), possibly with additional terms, constants, multiplying factors and the like. In general, suitable functions assume an absolute minimum when two identical waveforms are considered, for example, a value of 0 in the case of the functionals of equations (3), (4) and (17), and increase in value when different waveforms are considered.

It is to be understood that the above embodiments are to be taken as illustrative and not as limiting the scope of the present invention, and further modifications may be performed by persons skilled in the art without departing from the scope of the present invention.

What is claimed is:

1. A method for characterizing signals, the method comprising:

providing a first signal waveform and a second signal waveform;
providing a functional depending on the first signal waveform and the second signal waveform, wherein a time variable of the second signal waveform is subjected to an affine transformation with at least one transformation parameter, and wherein the functional is based on a cross entropy functional; and
determining, in a computer, at least one value of the at least one transformation parameter at which the functional assumes a minimum.

2. The method according to claim 1, wherein the functional comprises a term of the form $$\int dt p(t) \ln \frac{p(t)}{q(t)},$$

wherein p(t) is a function based on one of the first signal waveform and the second signal waveform and q(t) is a function based on the other one of the first signal waveform and the second signal waveform.

3. The method according to claim 1, wherein the functional comprises a term of the form $$\sum_i p_i \ln \frac{pi}{qi},$$

wherein i is an element index, $p_i$ is a distribution based on one of the first signal waveform and the second signal waveform and $q_i$ is a distribution based on the other one of the first signal waveform and the second signal waveform.

4. The method according to claim 1, wherein providing a functional comprises differentiating the first signal waveform and the second signal waveform.

5. The method according to claim 4, wherein providing a functional further comprises normalizing the differentiated first signal waveform and the differentiated second signal waveform.

6. The method according to claim 1, wherein the at least one transformation parameter comprises a time shift parameter determining a time shift of the second signal waveform.

7. The method according to claim 6, further comprising taking a value of the functional at the time shift value as a measure for a waveform difference between the first signal waveform and the second signal waveform.

8. The method according to claim 6 further comprising taking the time shift value as a measure for a delay between the first signal waveform and the second signal waveform.

9. The method according to claim 1, wherein the at least one transformation parameter comprises a slew parameter determining the slope of the second signal waveform.

10. The method according to claim 1, wherein the second signal waveform occurs later in time than the first signal waveform.

11. The method according to claim 1, wherein the first signal waveform comprises a reference signal waveform.

12. The method according to claim 1, wherein the first signal waveform and the second signal waveform are obtained by a computer-based analysis of an electronic circuit.

13. The method according to claim 1, wherein the first signal waveform and/or the second signal waveform is obtained by a measurement.

14. The method according to claim 1, wherein the first signal waveform and/or the second signal waveform depends on at least one parameter, the method further comprising performing an optimization using the at least one parameter.

15. The method according to claim 14, wherein the at least one parameter comprises at least one parameter taken from the group consisting of circuit parameters describing the circuit wherein the at least one signal waveform propagates, timing parameters describing the timing of the at least one signal waveform, crosstalk parameters describing the influence of crosstalk from at least one aggressor net and further parameters describing the timing of signals in the aggressor net.

16. The method according to claim 14, further comprising providing at least one constraint for the at least one parameter, wherein the optimization comprises varying the at least one parameter under the at least one constraint.

17. The method according to claim 16, wherein the optimization comprises performing a Lagrange optimization.

18. The method according to claim 14, wherein the optimizing step comprises determining the at least one parameter such that the functional is optimized.

19. The method according to claim 14, wherein the optimization comprises determining the at least one parameter such that the at least one value of the at least one transformation parameter is optimized.

20. The method according to claim 14, further comprising optimizing a circuit design based on the at least one parameter after the optimization.

21. The method of claim 1, wherein the computer comprises a personal computer.

22. A method for determining an equivalent signal waveform, the method comprising:
providing an original signal waveform;
providing a base signal waveform comprising at least one parameter determining a waveform of the base signal waveform;
providing a cross entropy-based functional depending on the original signal waveform and the base signal waveform;
using a computer, optimizing the functional to obtain at least one optimized value for the at least one parameter; and
representing the original signal waveform by the base signal waveform comprising the at least one parameter, wherein the at least one parameter comprises the at least one optimized value.

23. The method according to claim 22, further comprising using the equivalent signal waveform in a static timing analysis.

24. The method according to claim 22, wherein the optimizing step comprises determining the at least one parameter such that the functional is minimized.

25. The method according to claim 22, wherein the base signal waveform is chosen from the group consisting of a ramp-shaped waveform, a gamma-shaped waveform, a Gaussian waveform, a Weibull function, a waveform of an exponential family, a beta-shaped waveform and a sigmoid-shaped waveform.

26. The method of claim 22, wherein the computer comprises a personal computer.

27. A tangible non-transitory computer readable storage medium comprising a program code, the program code, when executed on a computer system, carrying out the steps of:

providing a first signal waveform and a second signal waveform;

providing a functional depending on the first signal waveform and the second signal waveform, wherein a time variable of the second signal waveform is subjected to an affine transformation with at least one transformation parameter, and wherein the functional is based on a cross entropy functional; and determining at least one value of the at least one transformation parameter at which the functional assumes a minimum.

28. The tangible computer readable storage medium according to claim 27, wherein the step of providing a functional comprises differentiating the first signal waveform and the second signal waveform.

29. The tangible computer readable storage medium according to claim 27, wherein the at least one transformation parameter comprises a time shift parameter determining a time shift of the second signal waveform.

30. The tangible computer readable storage medium according to claim 29, the steps further comprising:

taking a value of the functional at the time shift value as a measure for a waveform difference between the first signal waveform and the second signal waveform.

31. The tangible computer readable storage medium according to claim 29, the steps further comprising:

taking the time shift value as a measure for a delay between the first signal waveform and the second signal waveform.

32. The tangible computer readable storage medium according to claim 27, wherein the first signal waveform and the second signal waveform are obtained by a computer-based analysis of an electronic circuit.

33. The tangible computer readable storage medium according to claim 27, wherein a computer-based analysis is performed by the program code when executed on the computer.

34. The tangible computer readable storage medium according to claim 26, wherein the data carrier is chosen from the group consisting of a disk, a CD-ROM, a DVD, a semiconductor memory and a signal.

35. The tangible computer readable storage medium according to claim 27, wherein the data carrier is a memory in the computer system.

36. The tangible computer readable storage medium according to claim 27, wherein the first signal waveform and/or the second signal waveform depends on at least one parameter, the steps further comprising performing an optimization using the at least one parameter.

37. The tangible computer readable storage medium according to claim 36, wherein the at least one parameter comprises at least one parameter taken from the group consisting of circuit parameters describing the circuit wherein the at least one signal waveform propagates, timing parameters describing the timing of the at least one signal waveform, crosstalk parameters describing the influence of crosstalk from at least one aggressor net and further parameters describing the timing of signals in the aggressor net.

38. The tangible computer readable storage medium according to claim 36, the steps further comprising:

providing at least one constraint for the at least one parameter; and wherein the optimization comprises varying the at least one parameter under the at least one constraint.

39. The tangible computer readable storage medium according to claim 36, wherein the optimizing step comprises performing a Lagrange optimization.

40. The tangible computer readable storage medium according to claim 36, wherein the optimizing step comprises determining the at least one parameter such that the functional is maximized.

41. The tangible computer readable storage medium according to claim 36, wherein the optimizing step comprises determining the at least one parameter such that the at least one value of the at least one transformation parameter is optimized.

42. A tangible non-transitory computer readable storage medium comprising a program code, the program code, when executed on a computer system, carrying out the steps of:

providing an original signal waveform;

providing a base signal waveform comprising at least one parameter determining the waveform of the base signal waveform;

providing a cross entropy-based functional depending on the original signal waveform and the base signal waveform;

optimizing the functional to obtain at least one optimized value for the at least one parameter; and representing the original signal waveform by the base signal waveform comprising the at least one parameter, wherein the at least one parameter comprises the at least one optimized value.

43. The tangible computer readable storage medium according to claim 42, the steps comprising using the equivalent signal waveform in a static timing analysis.

44. The tangible computer readable storage medium according to claim 42, wherein the optimizing step comprises determining the at least one parameter such that the functional is minimized.

45. The tangible computer readable storage medium according to claim 42, wherein the base signal waveform is chosen from the group consisting of a ramp-shaped waveform, a gamma-shaped waveform, a Gaussian waveform, a Weibull waveform, a waveform of an exponential family, a beta-shaped waveform and a sigmoid-shaped waveform.

46. The tangible computer readable storage medium according to claim 42, wherein the data carrier is chosen from the group consisting of a disk, a CD-ROM, a DVD, a semiconductor memory and a signal.

47. The tangible computer readable storage medium according to claim 42, wherein the data carrier is a memory in the computer system.

* * * * *